United States Patent [19]

Ehrenberg et al.

[11] Patent Number: 5,232,548
[45] Date of Patent: Aug. 3, 1993

[54] DISCRETE FABRICATION OF MULTI-LAYER THIN FILM, WIRING STRUCTURES

[75] Inventors: Scott G. Ehrenberg, Fishkill; L. Wynn Herron, Hopewell Junction, both of N.Y.; Ekkehard F. Miersch, Schoenaich, Fed. Rep. of Germany; Jae Park, Somers; Janet L. Poetzinger, Pleasant Valley, both of N.Y.

[73] Assignee: International Business Machines Corporation, Armonk, N.Y.

[21] Appl. No.: 784,345

[22] Filed: Oct. 29, 1991

[51] Int. Cl.$^5$ .......................... B44C 1/22; C23F 1/00
[52] U.S. Cl. .................................. 156/630; 156/634; 156/645; 156/656; 156/902; 29/852; 427/97; 428/209; 428/901
[58] Field of Search ............... 156/629, 630, 631, 633, 156/634, 644, 645, 650, 655, 656, 901, 902; 29/846, 848, 852, 874, 884, 883; 174/250; 428/209, 901, 425; 427/96, 97

[56] References Cited

U.S. PATENT DOCUMENTS

| | | | |
|---|---|---|---|
| 2,692,190 | 10/1954 | Pritikin | 156/631 |
| 3,181,986 | 5/1965 | Pritikin | 156/233 |
| 3,465,435 | 9/1969 | Steranko | 156/629 |
| 3,466,206 | 9/1969 | Beck | 156/629 |
| 3,541,222 | 11/1970 | Parks et al. | 174/68.5 |
| 3,554,877 | 1/1971 | Geisler | 204/15 |
| 3,606,677 | 12/1967 | Ryan | 29/846 X |
| 4,604,160 | 8/1986 | Murakami et al. | 156/630 |
| 4,642,160 | 2/1987 | Burgess | 156/630 |
| 4,707,657 | 11/1987 | Boegh-Petersen | 324/158 F |
| 4,830,691 | 5/1989 | Kida et al. | 156/631 |
| 4,830,704 | 5/1989 | Voss et al. | 156/629 |
| 4,970,106 | 11/1990 | DiStefano et al. | 156/902 X |

FOREIGN PATENT DOCUMENTS 108987 5/1987 Japan .

Primary Examiner—William A. Powell
Attorney, Agent, or Firm—Whitham & Marhoefer

[57] ABSTRACT

A multilayer, three-dimensional wiring matrix is fabricated from a plurality of individually testable plane pair sub-units (30). Each of the plane pair sub-units (30) includes a compensator (20) with capping layers (32) laminated on either side. The compensator (20) has a dielectric (14) encapsulated foil (10) which has been patterned with holes (12). Metallization patterns on the surfaces of the compensator (20) provide orthogonal wiring (22), electrical connections (24) to the foil (10), and electrical connections (26) between the top and bottom surfaces. The capping layer (32) includes joining metallurgy (38) at selected locations within a dielectric layer (36) that is in registry with the metallization in the vias (16). The joining metallurgy (38) may be a metal loaded thermoplastic and provides a seal for the vias (16) as well as planarizes the structure. The capping layers (32) may be formed in-situ on the compensator or separately.

19 Claims, 2 Drawing Sheets

DISCRETE FABRICATION OF MULTI-LAYER THIN FILM, WIRING STRUCTURES

CROSS-REFERENCE TO RELATED APPLICATIONS

This patent application is related to U.S. patent application Ser. No. 07/784,281, "Structure and Process for Thin Film Interconnect" and U.S. patent application Ser. No. 07/783,281, "Fabrication of Discrete Thin Film Wiring Structures", both of which are filed on even date herewith and both of which are herein incorporated by reference".

BACKGROUND OF THE INVENTION

1. Field of the Invention

The present invention generally relates to structure and process for multi-layer thin film wiring structures and, more particularly, to the fabrication of multi-layer thin film structures in a non-serial manner by creating testable sub-units and then joining them together to form a finished three-dimensional wiring matrix.

2. Description of the Prior Art

Fabrication of multi-layer thin film interconnect structures for high-density integrated circuits generally involves the sequential build up of metal-patterned dielectric layers on silicon or ceramic substrates. Among the various dielectric/insulator materials in thin film structures, sputtered (or PECVD) quartz, silicon nitride, and high-temperature stable polymers, especially polyimides, are most commonly used in conjunction with high-conductivity metallurgy such as aluminum/copper, gold, and/or copper.

The approach based on sequential building of each layer to form high-density wiring structures, however, suffers from the problem that every time a new layer is fabricated, the previously built layers are exposed to the entire process excursions including thermal, chemical solvents, mechanical and other stress-related operations. In addition, since the electrical performance and long-term reliability of the sequentially built structure can only be determined after the conclusion of the entire fabrication process, the finished part may have to be discarded if the performance does not meet the required specifications. This results in high cost of production and has other obvious limitations in terms of cycle time and throughput.

When using polyimide dielectric (or other high-temperature polymers), an alternate approach to thin film interconnect structures is based on the assembly of individual electrically testable metallized thin films (layers) which are laminated at high temperature such that metal-to-metal and polymer-to-polymer bonding can be achieved. This method eliminates some of the limitations of the sequential process, as each metallized dielectric layer is fabricated as a single unit which can be fully tested for the desired electrical characteristics, then multiple layers are stacked and laminated under heat and pressure. Although this method would be potentially superior to the sequential build up of layers, it has a fundamental problem with regard to the dimensional stability of the structure during both individual layer build and during the joining of the individual layers to form the composite structure. This is due to the fact that the thin polyimide films are generally fragile and flexible and are subject to deformation under thermal or solvent-related stress conditions. This can result in pattern misalignment and distortion during layer fabrication or in the process of lamination and also when the composite structure undergoes accelerated reliability tests involving temperature and humidity excursions.

Japanese Patent No. J63-274199 (Application No. (1987) 62-108987) discloses a "Multilayer Wiring Formation Method" involving the build up of individual layers comprising polyimide insulator with copper wiring and copper/gold interface metal. This method is based on metal patterning of partially cured polyimide layers formed on a substrate, after which the layers are peeled off from the substrate, smoothed by vacuum, stacked, and then laminated in one step by heating under pressure. During this process, interlayer bonding occurs due to polymer interdiffusion at the interface which is also accompanied by full polymer cure, and at the same time gold/gold joining causes metal interconnections. However, this process suffers from the limitations of potential pattern misalignment and distortion, as mentioned above.

The following U.S. patents relate generally to methods of forming metallurgical patterns in insulator films:

U.S. Pat. No. 2,692,190 to Pritikin is concerned with a method for generating embedded metallurgy to fabricate printed circuits having large dimensions on a temporary base plate which is removed by chemical etching. After the conductor pattern is defined and an insulator, such as Teflon®, polystyrene, etc., is applied, the base plate is removed by a selective etching process.

U.S. Pat. No. 3,181,986 to Pritikin also relates to printed circuits with the difference from the above patent being that the temporary base plate is not consumed and thus the process is less expensive.

U.S. Pat. No. 3,466,206 to Beck relates to embedded printed circuits having integral aligned through terminals exposed on both sides by a substractive etch process. The metal sheet is copper, silver, gold, brass, stainless steel, etc., and the insulator is a thermosetting or cold-setting resin, self-hardening resin or one which requires heat and pressure to cure, including epoxies, phenolics, melamine, Teflon, or composites with glass fillers.

U.S. Pat. No. 3,541,222 to Parks et al. is concerned with a connector screen or "interposer" comprising conductive connector elements embedded in a deformable insulator such that the conductive elements are protruding from both sides.

U.S. Pat. No. 4,604,160 to Murakami et al. relates to a method for fabricating a flexible printed wiring board with emphasis on the adhesion of the plating resist and the conductor pattern during the plating process.

U.S. Pat. No. 4,707,657 to Boegh-Petersen is concerned with double-sided printed circuit boards of a connector assembly, thin film and thick film circuit board, and multilayer circuit board.

SUMMARY OF THE INVENTION

It is therefore an object of this invention to provide a high density, multilayer thin film structure and process for its manufacture wherein multiple individually testable subunits are fabricated in parallel, pretested for operational performance, and joined together to form a three dimensional wiring matrix.

It is another object of this invention to provide a base structure used in fabricating the subunits of the high density, multilayer thin film structure called a compensator which includes a metal reinforced dielectric that may support two levels of signal wiring wherein the metal reinforcement provides accurate dimensional stability and rigidity for handling and processing as well as controls the thermal expansion of the compensator and provides a electrical ground or reference plane.

It is another object of the invention to identify materials which are advantageous in forming the compensator structure where the materials provide a planar layer on which circuitry can be formed and have good adhesion with the metal reinforcement.

It is yet another object of the invention to provide structures and methods for "capping" vias formed in the compensator wherein the vias are sealed with a metallized material which is electrically connected to the metallization on the compensator and is used to electrically interconnect the sub-units of the high density, multilayer thin film structure.

It is still another object of the invention to identify materials suitable for capping the vias formed in the compensator and especially to utilize a flowable, metal loaded thermoplastic material for such a purpose.

According to the invention, high density, multilayer thin film structures are fabricated by producing a plurality of individually testable sub-units in parallel and then joining the units to form a three dimensional wiring matrix. The individually testable sub-units are called plane pair sub-units and are planar in shape and include interconnection sites on both sides.

A base structure for fabricating the plane pair sub-units is called a compensator and includes a metal reinforced dielectric with metallized circuitry formed on both its top and bottom surface. The metal reinforcement material has a thermal coefficient of expansion which matches that of integrated circuit devices or the like which may be connected to the multilayer structure. The compensator provides dimensional stability which is important for fabricating the multilayer structure. Multiple vias are formed through the compensator to allow circuitry on either side of the compensator to be connected using metallization deposited in the via. In addition, circuitry on different plane pair sub-units can be electrically connected using the interconnection sites which "cap" the vias. Metallized vias are also used to electrically connect circuitry on the surfaces of the compensator to the metal reinforcement so that it may serve the function of a ground or power plane. The capping layers which are applied to the compensator protect the metallization on the compensator, seal the vias for reliability, and ensure the planarity necessary for testing and joining the plane pair sub-units. The capping layers can be formed directly on the compensator or separately on a removable substrate. Preferably, the interconnection sites or "caps" in the capping layers are formed of a metal loaded thermoplastic material which is flowable and compatible with the dielectric used in the capping layer.

The plane pair sub-units thus formed are tested then stacked and aligned to bring the electrically conductive via joining surfaces into contact on a stiffener. The stiffener can also have an electrical function such as a ground plane or power distribution and wiring plane. Examples of such a stiffener would be a multi-layer ceramic substrate. The whole assembly is subjected to elevated temperatures and pressures to interdiffuse electrical joints at the via interfaces and to interdiffuse the dielectric interfaces. To complete the formation of the three-dimensional wiring matrix, the unit is then electrically tested and sent on to have the electrical components joined along with the connectors and cooling hardware.

BRIEF DESCRIPTION OF THE DRAWINGS

The foregoing and other objects, aspects and advantages will be better understood from the following detailed description of a preferred embodiment of the invention with reference to the drawings, in which:

FIG. 6 is an edge view showing two "capping layers" formed on respective carriers prior to lamination to the compensator of FIG. 5a;

DETAILED DESCRIPTION OF A PREFERRED EMBODIMENT OF THE INVENTION

Figure 1:
FIG. 1 is an edge view showing a thin metal foil that is used to form the metal core of the compensator.

Referring now to the drawings, and more particularly to FIG. 1, there is shown a foil 10 having a low thermal coefficient of expansion and a high melting point. Preferably, the thermal coefficient of expansion is in the range of 2 to 22 ppm and matches that of many electronic components. Suitable materials for the foil 10 include copper-Invar-copper, molybdenum, titanium, copper, tungsten, Kovar, or the like. Preferably the foil is between 1 and 2 mils thick.

Figure 2:
FIG. 2 is an edge view showing the metal core of the compensator after it has been patterned with holes.

FIG. 2 shows the foil 10 patterned with a plurality of holes 12. The holes 12 can be created by a variety of well known techniques such as photoprocessing, punching, and laser drilling. The location of the holes 12 is performed in a controlled manner since they will act as vias for metallization interconnect lines between circuitry as will be described in more detail below. The foil 10 serves as the metal reinforcement of a compensator structure lescribed in conjunction with FIG. 5. The patterned foil 10 provides the dimensional accuracy to support high via densities and a thermal expansion match to electronic components which may be connected to the multilayer thin film structure produced. In addition, the foil 10 serves as an electrical ground or reference plane. As a solid reference plane, the foil 10 enhances the performance of the multilayer thin film structure produced.

Figure 3:
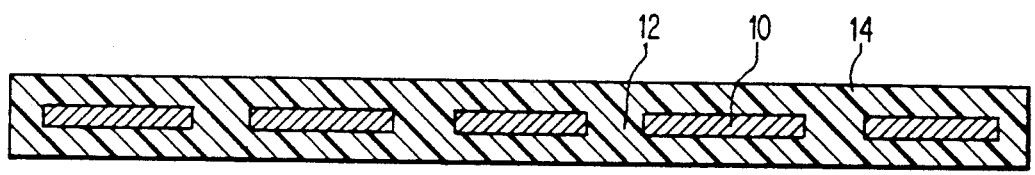
FIG. 3 is an edge view showing the metal core of the compensator after encapsulation in a dielectric.

FIG. 3 shows the foil 10 encapsulated in a dielectric material 14. The dielectric material 14 may be any of a number of different materials such as Kapton, Teflon, filled Teflon, epoxies, or the like. In a preferred embodiment, the dielectric material 14 is a fully cured and annealed thermoplastic material which has a low glass transition temperature (Tg) such as Teflon (polytetrafluoroethylene), polysulfone, or polyimide-siloxane. In addition, the dielectric material 14 may be a high Tg polymer which is coated with a low Tg polymer. The dielectric material 14 may be applied on the foil 10 by many well known techniques such as lamination, rollercoating, gas or vapor-phase polymerization, electrophoretic deposition, or injection molding. In a preferred embodiment, the fully cured, low Tg, dielectric material 14 is applied to the foil 10 by lamination. When the dielectric material 14 has a low Tg, it is capable of flowing at low temperatures so that the holes 12 of the foil 10 become filled and a planar structure is easily created. Also, when curing is not required and low Tg materials are used, the dielectric material 14 is likely to have low stress which is beneficial in handling and processing high density circuitry.

Figure 4:
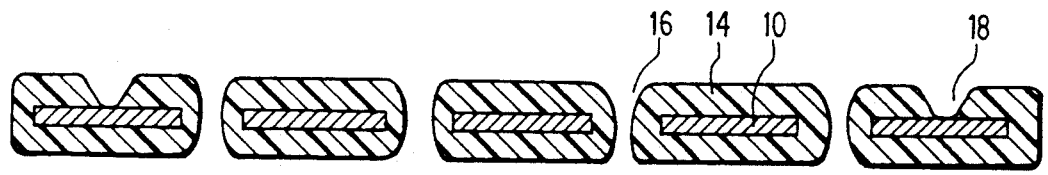
FIG. 4 is an edge view showing the encapsulated metal core after the dielectric has been patterned with holes.

FIG. 4 shows that the dielectric material 14 of the encapsulated foil 10 is re-patterned to create a plurality of vias 16 which pass completely through the structure and vias 18 which expose the foil 10. The vias 16 and 18 may be created by many standard techniques including, for example, punching, laser drilling, or photo-etching. The vias 16 provide a passage which allows metallization to interconnect circuitry that will be formed on the top and bottom of the structure. The vias 18 provide a passage for metallization to connect to the foil 10 when it will be used as a ground or reference plane. While FIG. 3 shows the patterned foil 10 with the dielectric material 14 filling the holes 12, using gas or vapor-phase polymerization or electrophoretic deposition as the technique for applying the dielectric material 14 has some advantages in that the polymer created conforms to the surfaces of the foil 10 and it would be possible to create a structure similar to FIG. 4, but lacking the vias 18, directly. Hence, only the vias 18 would need to be made during re-patterning.

Figure 5A:
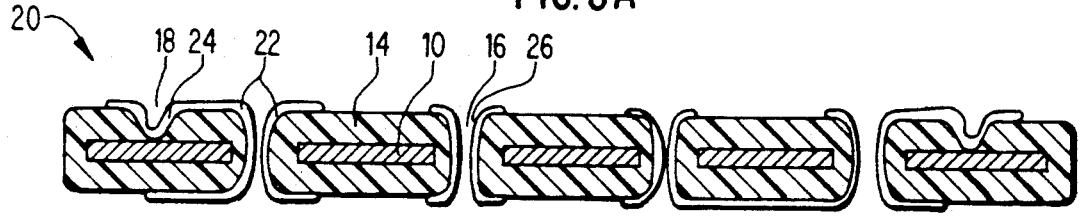
FIG. 5a is an edge view showing the patterned and encapsulated compensator metallized to form orthogonal wiring layers.
Figure 5B:
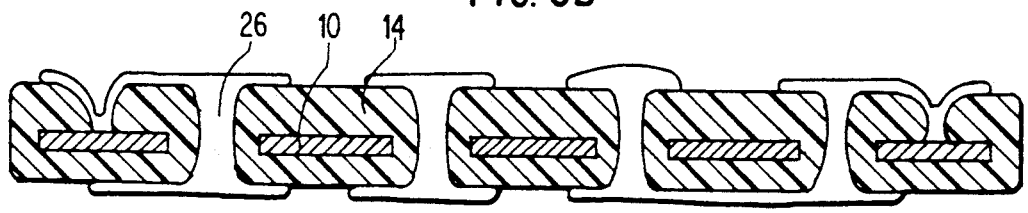
FIG. 5b is an edge view similar to that shown in FIG. 5a except the vias have been filled with metal.

FIG. 5a shows the structure of the compensator 20 which is an important part of the present invention. The compensator 20 is fabricated by subjecting the re-patterned structure of FIG. 4 to a series of metallization steps which create orthogonal wiring layers 22 on the surface of the dielectric material 14, connecting lines 24 in the vias 18 which connect the wiring layers 22 to the foil 10 for grounding or reference plane purposes, and metal 26 in the vias 16 for electrically connecting the circuitry on the top and bottom surfaces of the compensator. The metallization steps can be performed by many different well known techniques including, for example, blanket plating and subtractive etching or additive plating using patterned photo-resist. The hollow via structure shown in FIG. 5a minimizes processing steps since the vias 16 can be metallized simultaneously with the orthogonal wiring 22 on the top and bottom surfaces of the compensator 20. If desired, the metal 26 in the vias 16 can be made solid, as is shown in FIG. 5b, by adding a metal paste or by other means. During metallization, it is preferable to apply a joinable material such as gold to the metal 26 in the vias 16 in order to facilitate subsequent joining steps. At this point in the fabrication process, the compensator 20 can be inspected for defects, repaired and sorted.

Figure 6:
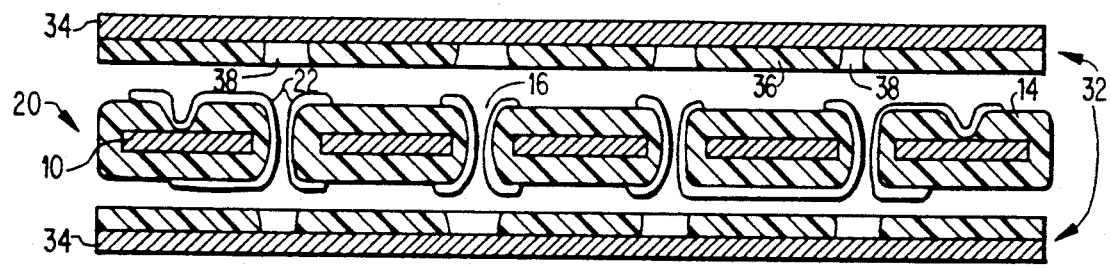
Figure 7:
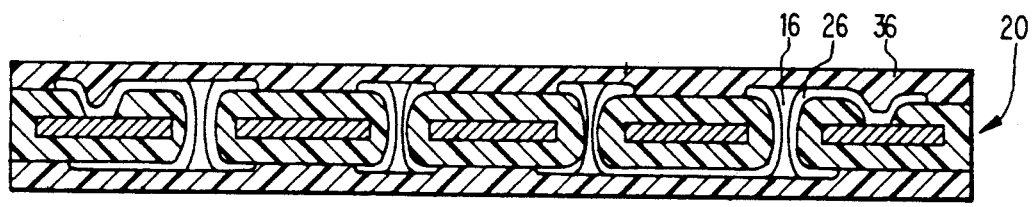
FIG. 7 is an edge view showing a compensator like that shown in FIG. 5a, where dielectric layers have been applied to the top and bottom surfaces.
Figure 8:
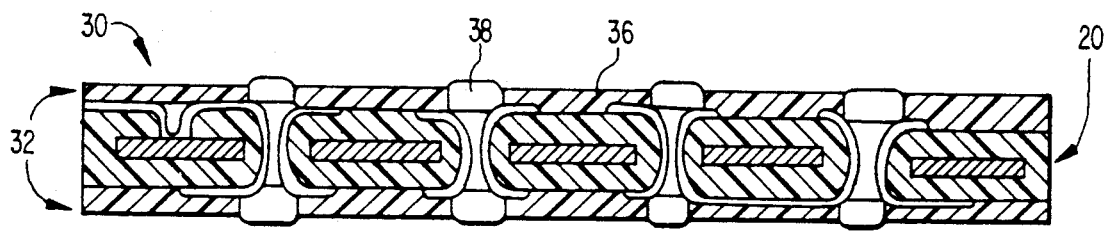
FIG. 8 is an edge view showing that a plane pair sub-unit which includes the compensator of FIG. 5 and which is formed as described with techniques relating to FIGS. 6 and 7.

In order to complete a plane pair sub-unit for testing and subsequent incorporation into a multilayer thin film structure, the hollow via 16 is topped with a solid "cap". The cap assures the structure is planar which is necessary for testing and joining purposes, and the cap seals the via 16 which enhances reliability. FIGS. 6 and 7 show alternative techniques for fabricating the cap structure and FIG. 8 shows the plane pair sub-unit 30 which results.

FIG. 6 shows the capping layer 32 being built separately from the compensator 20. The capping layer 32 is formed on a dimensionally stable, etchable metal carrier 34 which has a thermal coefficient of expansion similar to that of the foil 10 in the compensator 20. Suitable materials for the carrier 34 include molybdenum, copper and Invar. To process discretely formed capping layers 32, a dielectric 36 is applied to the metal carrier 34, blind holes are made in the dielectric 36 at points which correspond to the vias 16 in the compensator 20, and joining metallurgy 38 fills the blind holes. The dielectric 36 can be applied to the carrier 34 by lamination or other suitable techniques. The dielectric 36 should be compatible with the dielectric 14 of the compensator 20 so that they can bond together. The blind holes in the dielectric 36 can be created by laser drilling, photoprocessing, or by other suitable techniques. The joining metallurgy 38 can be applied by such techniques as screening or plating, for example. The capping layers 32 are then laminated to the top and bottom of the compensator 20 and the metal carriers 34 are removed by etching, chemical solvation, or by other means to yield the plane pair sub-unit 30 of FIG. 8. Having the carrier 34 and the foil 10 have similar thermal coefficients of expansion assures that the joining metallurgy 38 and vias 16 will stay aligned during lamination. The lamination step is performed under elevated temperatures and pressures such that the joining metallurgy 38 interdiffuses with the metal 22 at the vias 16 and the dielectric 36 bonds with the dielectric 14 of the compensator 20.

FIG. 7 illustrates an in-situ technique for creating the capping layers 32 directly on the compensator 20. In operation, the dielectric 36 is applied directly to the top and bottom of the compensator 20. Depending on the viscosity of the dielectric 36, the vias 16 will either remain hollow or be filled. Holes are then created through the dielectric 36 to the vias 16, and the joining metallurgy 38 is subsequently deposited in the holes. As described above, laser drilling, photoprocessing and other techniques can be used to make the holes in the dielectric 36. Likewise, screening, plating, evaporation, and other techniques can be used for applying the joining metallurgy 38. As described above, the structure is laminated under temperature and pressure conditions which cause interdiffusion joints between the metal 22 at the vias 16 and the joining metallurgy 38 as well as bonding between the dielectric 36 and the dielectric material 14 of the compensator 20.

The joining metallurgy 38 used in either the separate capping layer formation technique of FIG. 6 or the in-situ technique of FIG. 7 can be conventional materials such as lead-tin (Pb-Sn), gold-tin (Au-Sn), gold, or aluminum. However, in a preferred embodiment, the joining metallurgy 38 is a metal-loaded thermoplastic adhesive material. The thermoplastic material is selected for solubility in a solvent which allows it to be mixed with metal powders such as silver and gold, for example, to make a screenable paste. Suitable thermoplastic materials and solvents would be the following: polysulfone, polyimide-siloxane, polyetherimide, dimethylformamide, and xylene. The paste is then screened into holes formed in the dielectric 36 and the solvents are allowed to dry. Subsequently, the capping layers 32 and compensator 20 are laminated together to form the completed plane pair sub-unit. Preferably, the screenable conductive paste is tailored such that the electrical via joining and dielectric bonding are compatible. Further advantages of the thick film screening procedure are that no additional photolithographic processes are required and the technique is contamination insensitive.

Figure 9:
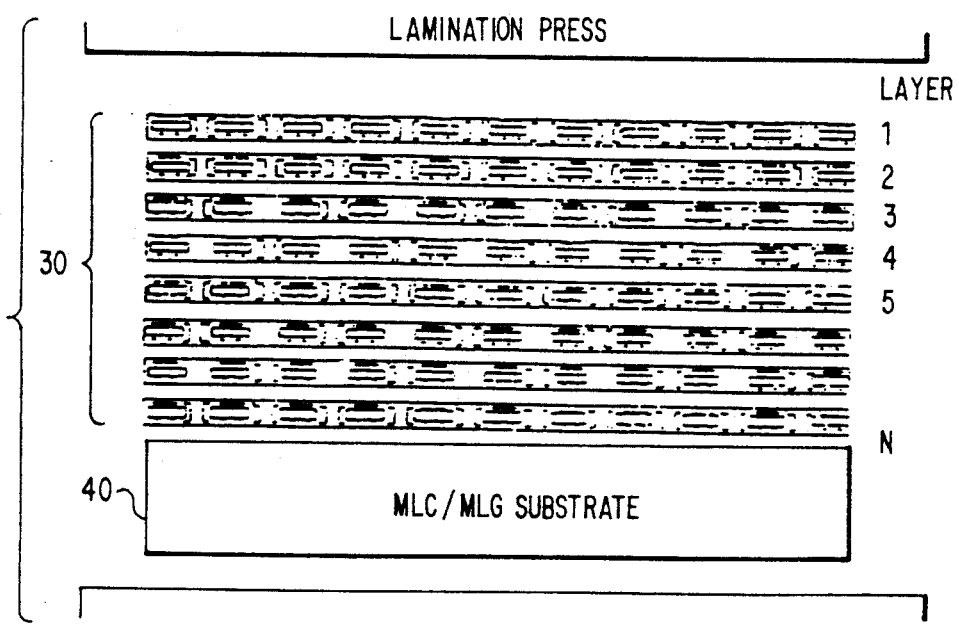
FIG. 9 is a side view showing a stack of plane pair sub-units like those of FIG. 8 on a stiffener in a lamination press.

The plane pair sub-units 30 of FIG. 8 are then tested and sorted. The plane pair sub-units 30 which test positive are stacked with the joining metallurgy 38 of each plane pair sub-unit 30 being in proper alignment with the joining metallurgy 38 of adjacent plane pair sub-units 30. The entire stacked assembly is then subjected to elevated temperatures and pressures in a lamination press which causes interdiffusion of the via electrical connections and bonding of the dielectric interfaces where the end product is a multilayer, three-dimensional wiring matrix. FIG. 9 shows that the stacked assembly of plane pair sub-units 30 may also be joined by lamination to a stiffener or another electronic package 40 such as a multi-layer ceramic, flex cable or card structure. The high density multilayer structure may be laminated to form a testable high performance organic module and has the advantage of being able to be relaminated to additional components due to the thermoplastic nature of the materials and joints.

The fabrication process according to the invention has several benefits. First, fabrication time is reduced because all sub-units can be created simultaneously allowing a multilayer thin film structure to be manufactured in the same amount of time as a single layer structure. Second, since all sub-units are testable, defects can be screened out before joining. Third, the plane pair sub-units produced according to the invention can be joined to any expansion matched surface, thus allowing them to complement and/or supplement existing packaging technologies, including multilayer ceramic, glass epoxy boards, etc. Fourth, by careful selection of the dielectric material and metal conductors, the individual sub-units, and thus the finished structure, can have a tailored thermal expansion so that many types of electronic components, such as flip-chip ICs, surface mount components, tab-bonded components, and wire bonded components can be joined to the surface. Fifth, a variety of low thermal coefficient of expansion dielectrics in varying thicknesses along with a corresponding scaling of wiring dimensions allow both high and low density sub-units to coexist within the same structure. The resulting electronic package is therefore totally tailorable to prescribed electrical requirements.

While the invention has been described in terms of its preferred embodiments, those skilled in the art will recognize that the invention can be practiced with modification within the spirit and scope of the appended claims.

Having thus described our invention, what we claim as new and desire to secure by Letters Patent is as follows:

1. A method for fabricating a multilayer interconnect structure, comprising the steps of:
   patterning a foil with a plurality of holes; ,;
   encapsulating said foil in a first dielectric to create an encapsulated foil having planar top and bottom surfaces;
   creating a plurality of vias in said first dielectric, a number of said vias passing through said holes in said foil and at least one of said vias terminating at said foil underneath said first dielectric;
   forming metallized patterns on at least one planar surface of said encapsulated foil and in said plurality of vias in said encapsulated foil, said metallized patterns in said vias which pass through said holes in said foil providing an electrical connection which extends between said top and bottom surfaces of said encapsulated foil, said metallized pattern in a via which terminates at said foil underneath said first dielectric providing an electrical connection with said foil;
   applying capping layers, each of which include a second dielectric and a plurality of electrical interconnection sites filled with joining metallurgy, to said top and bottom surfaces of said encapsulated foil, said electrical interconnection sites being in registry with said vias in said encapsulated foil which pass through said holes in said foil; and
   joining said capping layers with said top and bottom surfaces of said encapsulated foil to form a plane pair sub-unit in which said metallized patterns in said vias which pass through said holes in said foil form an electrical connection with said joining metallurgy in said capping layers and said first dielectric of said encapsulated foil and said second dielectric of said capping layers bond together.

2. A method as recited in claim 1 wherein said step of encapsulating said foil is performed by laminating a fully cured thermoplastic material having a low glass transition temperature onto said foil, said fully cured thermoplastic material developing an adhesion to said foil and filling said holes in said foil.

3. A method as recited in claim 1 wherein said step of encapsulating said foil is performed by laminating a first fully cured material having a high glass transition temperature having a coating of a second fully cured thermoplastic material which has a low glass transition temperature onto said foil, said second fully cured thermoplastic material developing an adhesion to said foil and filling said holes in said foil.

4. A method as recited in claim 1 wherein said step of encapsulating said foil is performed by a controlled conformal process which simultaneously encapsulates said foil and creates said vias which extend through said holes in said foil.

5. A method as recited in claim 1 wherein said step of applying said capping layers includes the following steps:
   forming layers of said second dielectric on dimensionally stable carriers;
   creating blind holes in said layers of said second dielectric;
   filling said blind holes with said joining metallurgy to create a structure having a carrier topped with a capping layer comprised of a dielectric and joining metallurgy;
   laminating at least two of said structures having said carrier topped with said capping layer to said top and bottom surfaces of said encapsulated foil, respectively; and
   removing said carriers from said top and bottom surfaces of said encapsulated foil while leaving said capping layers thereon.

6. A method as recited in claim 5 wherein said joining metallurgy is a metal loaded thermoplastic material in the form of a screenable paste and said step of filling said blind holes includes the steps of depositing said screenable paste into said blind holes and allowing a solvent in said screenable paste to dry.

7. A method as recited in claim 5 wherein the thermal coefficient of expansion of said foil and said carrier are approximately equal.

8. A method as recited in claim 1 wherein said step of applying said capping layers includes the steps of:
coating said second dielectric on said top and bottom surfaces of said encapsulated foil;
forming blind holes in said second dielectric at points in registry with said vias which pass through said holes in said foil;
depositing joining metallurgy in said blind holes in said second dielectric to complete capping layers including said second dielectric and said joining metallurgy in-situ on said encapsulated foil; and
joining said capping layers to said encapsulated foil wherein said joining metallurgy forms an electrical connection with said metallized patterns in said vias which pass through said holes in said foil and said second dielectric bonds together with said first dielectric.

9. A method as recited in claim 8 wherein said joining metallurgy is a metal loaded thermoplastic material in the form of a screenable paste and said step of depositing includes the steps of filling said blind holes with screenable paste and allowing a solvent in said screenable paste to dry.

10. A method as recited in claim 1 further comprising the steps of:
stacking a plurality of plane pair sub-units with electrical interconnection sites of the capping layers of adjacent plane pair sub-units in alignment; and
laminating said plane pair sub-units together to form a three dimensional wiring matrix.

11. A method as recited in claim 1 further comprising the steps of:
stacking a plurality of plane pair sub-units with electrical interconnection sites of the capping layers of adjacent plane pair sub-units in alignment;
positioning the stack of plane pair sub-units on a stiffener or electronic component; and
laminating said plane pair sub-units and said stiffener or electronic component together to form a three dimensional wiring matrix as a unitary structure with said stiffener or electronic component.

12. A plane pair sub-unit for incorporation into a three dimensional wiring matrix, comprising:
a dielectric encapsulated foil including a foil patterned with a plurality of holes and a first dielectric encapsulating said foil, said first dielectric having a plurality of vias wherein a number of said vias pass through said holes in said foil and at least one of said vias opens on said foil;
metallized patterns formed on at least one of a top and bottom surface of said dielectric encapsulated foil;
first via metallizations in said vias passing through said holes in said foil, said first via metallizations providing an electrical connection which extends between said top and bottom surfaces of said dielectric encapsulated foil;
a second via metallization in a via which opens on said foil, said second via metallization providing an electrical connection with said foil; and
capping layers on said top and bottom surfaces of said dielectric encapsulated foil, said capping layers including a second dielectric having a plurality of electrical interconnection sites filled with joining metallurgy where said electrical interconnection sites are in registry with said first via metallizations.

13. A plane pair sub-unit as recited in claim 12 wherein said foil provides stiffness to said plane pair sub-unit and has a low thermal coefficient of expansion.

14. A plane pair sub-unit as recited in claim 12 wherein said foil serves as a ground or reference plane for said plane pair sub-unit via said electrical connection provided by said second metallization.

15. A plane pair sub-unit as recited in claim 12 wherein said first dielectric includes a thermoplastic having a low glass transition temperature.

16. A plane pair sub-unit as recited in claim 15 wherein said thermoplastic is selected from the group consisting of filled or unfilled polytetrafluoroethylene, polysulfone, and polyimidesiloxane.

17. A plane pair sub-unit as recited in claim 12 wherein said first via metallizations do not completely fill said vias and provide a hollow passage through said dielectric encapsulated foil.

18. A plane pair sub-unit as recited in claim 12 wherein said joining metallurgy is a metal filled thermoplastic.

19. A three dimensional wiring matrix comprised of a plurality of plane pair sub-units laminated together in an aligned stack, each of said plane pair sub-units comprising:
a dielectric encapsulated foil including a foil patterned with a plurality of holes and a first dielectric encapsulating said foil, said first dielectric having a plurality of vias wherein a number of said vias pass through said holes in said foil and at least one of said vias opens on said foil;
metallized patterns formed on at least one of a top and bottom surface of said dielectric encapsulated foil;
first via metallizations in said vias passing through said holes in said foil, said first via metallizations providing an electrical connection which extends between said top and bottom surfaces of said dielectric encapsulated foil;
a second via metallization in a via which opens on said foil, said second via metallization providing an electrical connection with said foil; and
capping layers on said top and bottom surfaces of said dielectric encapsulated foil, said capping layers including a second dielectric having a plurality of electrical interconnection sites filled with joining metallurgy where said electrical interconnection sites are in registry with said first via metallizations.

* * * * *